(12) United States Patent
Oyaizu et al.

(10) Patent No.: US 8,197,099 B2
(45) Date of Patent: Jun. 12, 2012

(54) ELECTRONIC COMPONENT MOUNTING MODULE AND ELECTRICAL APPARATUS

(75) Inventors: Tsuyoshi Oyaizu, Yokohama (JP); Seiko Kawashima, Yokosuka (JP); Haruki Takei, Kawasaki (JP); Naoko Matsui, Izumisano (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 146 days.

(21) Appl. No.: 12/625,917

(22) Filed: Nov. 25, 2009

(65) Prior Publication Data
US 2010/0135034 A1    Jun. 3, 2010

(30) Foreign Application Priority Data

Nov. 28, 2008 (JP) ................................. 2008-303670
Nov. 4, 2009 (JP) ................................. 2009-252591

(51) Int. Cl.
*F21V 29/00* (2006.01)
(52) U.S. Cl. .................. 362/294; 362/249.02; 362/373; 361/719
(58) Field of Classification Search .................. 362/294, 362/373, 249.02; 257/675; 361/704, 705, 361/707, 708, 719, 720
See application file for complete search history.

(56) References Cited

U.S. PATENT DOCUMENTS

| | | | | |
|---|---|---|---|---|
| 5,345,107 A | * | 9/1994 | Daikoku et al. | 257/717 |
| 5,355,280 A | * | 10/1994 | Rothlingshofer et al. | 361/705 |
| 5,781,412 A | * | 7/1998 | de Sorgo | 361/704 |
| 6,774,482 B2 | * | 8/2004 | Colgan et al. | 257/712 |
| 7,372,132 B2 | * | 5/2008 | Suzuki et al. | 257/676 |
| 7,719,108 B2 | * | 5/2010 | Murphy et al. | 257/706 |
| 7,794,115 B2 | * | 9/2010 | Hellinger et al. | 362/294 |
| 2004/0105264 A1 | * | 6/2004 | Spero | 362/276 |
| 2006/0018120 A1 | * | 1/2006 | Linehan et al. | 362/247 |

FOREIGN PATENT DOCUMENTS

| | | |
|---|---|---|
| JP | 3583019 | 10/2004 |
| JP | 2006-344690 | 12/2006 |

OTHER PUBLICATIONS

English language abstract of JP 2000-315756 which is now JP 3583019.
Machine English language translation of JP 2000-315756 which is now JP 3583019.
English language abstract of JP 2006-344690.
Machine English language translation of 2006-344690.

* cited by examiner

Primary Examiner — Peggy A. Neils
(74) Attorney, Agent, or Firm — DLA Piper LLP (US)

(57) ABSTRACT

The invention provides an electronic component mounting module capable of increasing the adhesion between the board and the heat radiating member, improving the thermal conductivity, and effectively radiating heat generated from the LEDs being an electronic component. The LEDs are mounted on the surface of the ceramics board, and the rear surface 1*b* side of the board is disposed at the heat radiating member. A metallic fine particle layer having high thermal conductivity and flexibility is made to intervene between the board and the heat radiating member.

2 Claims, 3 Drawing Sheets

|  | METALLIC FINE PARTICLE FILM | JUNCTION TEMPERATURE RATIO |
| --- | --- | --- |
| PRESENT EMBODIMENT | PROVIDED | 85 |
| COMPARATIVE EXAMPLE | NOT PROVIDED | 100 |

FIG. 5

ELECTRONIC COMPONENT MOUNTING MODULE AND ELECTRICAL APPARATUS

INCORPORATION BY REFERENCE

The present invention claims priority under 35 U.S.C. §119 to Japanese Patent Application Nos. 2008-303670 and 2009-252591 filed on Nov. 28, 2008 and Nov. 4, 2009, respectively. The contents of these applications are incorporated herein by reference in their entirety.

FIELD OF THE INVENTION

The present invention relates to an electronic component mounting module having electronic components, which generate heat when operating, mounted thereon, and an electrical apparatus.

BACKGROUND OF THE INVENTION

Generally, an electronic component such as a semiconductor element, etc., is subjected to such phenomena as a shortening in service life or a change in characteristics due to self-heat generation when a current flows thereto. In particular, light emitting elements such as an LED, and an EL element being an electronic component may be subjected to a lowering in optical output or adverse affects on service life in line with an increase in the temperature. Therefore, in a lighting device the light source of which depends on a light-emitting element such as an LED, an EL element, etc., it is necessary to control a temperature rise of the light-emitting elements in order to improve, service life and various characteristics of efficiency of the light-emitting elements.

Conventionally, as described in Japanese Patent Publication No. 3583019 (Paragraph No. 0016 and FIG. 2), in order to radiate heat generated from a semiconductor element, such a structure has been known in which a radiation wiring board of aluminum nitride, etc., having a semiconductor element mounted thereon and a radiator being a heat sink are integrated by tightening of screws. In addition, as described in Japanese Laid-Open Patent Publication No. 2006-344690 (Paragraph No. 0034 and FIG. 3), such a structure has been proposed in which a heat radiating structure having a number of fins are connected to a vitreous enamel board for mounting light emitting elements.

However, there are cases where minute unevenness and warping exist on the junction surface between a board and a heat sink or a heat radiation structure, or foreign substances are attached thereto. Therefore, mutual adhesion between the board and the heat sink or heat radiation structure is bad, and thermal conduction is not satisfactorily carried out. As a result, there is a problem by which heat radiation is not efficiently carried out.

The present invention was developed in view of the above-described problems, and it is therefore an object of the invention to provide an electronic component mounting module and an electrical apparatus, which are capable of increasing thermal conduction by improving the adhesion between a board and a heat radiation member and are capable of effectively radiating heat generated from electronic components.

SUMMARY OF THE INVENTION

An electronic component mounting module according to a first aspect of the invention includes a non-metallic board having an electronic component, which generates heat when operating, mounted on one surface thereof, and having the other surface disposed on a heat radiating member; and a metallic fine particle layer formed so as to be made to intervene between the other surface of the board and the heat radiating member.

According to the electronic component mounting module, since a metallic fine particle layer having high thermal conductivity and flexibility is made to intervene between a non-metallic board and a heat-radiating member, the adhesion between the board and the heat radiating member is increased, and the thermal conductivity is improved, wherein heat generated from an electronic component can be effectively radiated.

In the present invention and the following inventions, definitions and technical meanings of terms are as follows unless otherwise specified.

The electronic component includes, for example, a light emitting element such as an LED, an EL element, a semiconductor element such as a transistor, etc., IC or a resistance element, etc.

The heat radiating member includes, for example, a heat sink, an electrical apparatus body, a case or a cover, etc. In summary, the heat radiating member means a member that is thermally coupled to a board and has high thermal conductivity. For example, in a lighting device as an electrical apparatus, where the other side of the board is attached to the lighting apparatus body, the main body thereof corresponds to the heat radiating member.

Board includes any one of non-metallic materials such as ceramics, glass epoxy resin, etc. However, it is preferable that a material having satisfactory thermal conductivity of the non-metallic material is used.

A metallic fine particle layer is formed on the board or the heat radiating member or may be formed on both thereof. Further, the metallic fine particle layer may be formed to be separate from the board and the heat radiating member and to be made to intervene between the board and the heat radiating member.

The metallic fine particle layer is formed of, for example, metallic fine particles of silver, copper, aluminum, gold and an alloy thereof, the size of which is several microns (μm), and in which fine particles are heteromorphic, and, after paste in which such metallic fine particles are dispersed in a solvent is coated on a board or a heat radiating member by screen printing, the metallic fine particle layer is formed by heating the heat radiating member in a heating furnace, baking the paste and hardening the same. Also, the metallic fine particle layer may be formed by naturally hardening without baking the paste after the paste is coated on a board or a heat radiating member. Irregular gaps are formed between the metallic fine particles thus formed. The metallic fine particle layer thus formed has high thermal conductivity and has deformable flexibility by virtue of gaps between the particles.

An electronic component mounting module according to a second aspect of the invention is the electronic component mounting module according to the first aspect, in which the board is made of ceramics, and the electronic component is an LED.

According to the electronic component mounting module, since a metallic fine particle layer is made to intervene between the ceramics board and the heat radiating member, the adhesion between the ceramics board and the heat radiating member is increased, and the thermal conductivity is improved, wherein heat generated from the LED can be effectively radiated. Further, when disposing the ceramics board on the heat radiating member, it is possible to prevent the ceramics board from being cracked or broken.

An electronic component mounting module according to a third aspect of the invention is the electronic component mounting module according to the first aspect, in which the metallic fine particle layer is formed on a ceramics board.

According to the electronic component mounting module, since the metallic fine particle layer is formed on the ceramics board, formation of the metallic fine particle layer can be facilitated, and at the same time, the electronic component light emitting module can be easily combined with the heat radiating member.

An electrical apparatus according to a fourth aspect of the invention includes an electronic component mounting module according to any one of the first through the third aspects; and a heat radiating member in which a board of the electronic component mounting module is disposed with a metallic fine particle layer intervening therebetween.

According to the electrical apparatus, an electrical apparatus that can obtain effects brought about by the electronic component mounting module can be provided.

BRIEF DESCRIPTION OF THE DRAWINGS

FIG. 5 is a table showing the results of having measured the junction temperature ratios of an LED with respect to the present embodiment in which a metallic fine particle layer is made to intervene between the board of an electronic component mounting module and a heat radiating member and a comparative example in which no metallic fine particle layer is made to intervene.

DETAILED DESCRIPTION OF THE PREFERRED EMBODIMENT

Hereinafter, a description is given of one embodiment of the present invention with reference to the drawings.

Figure 1:
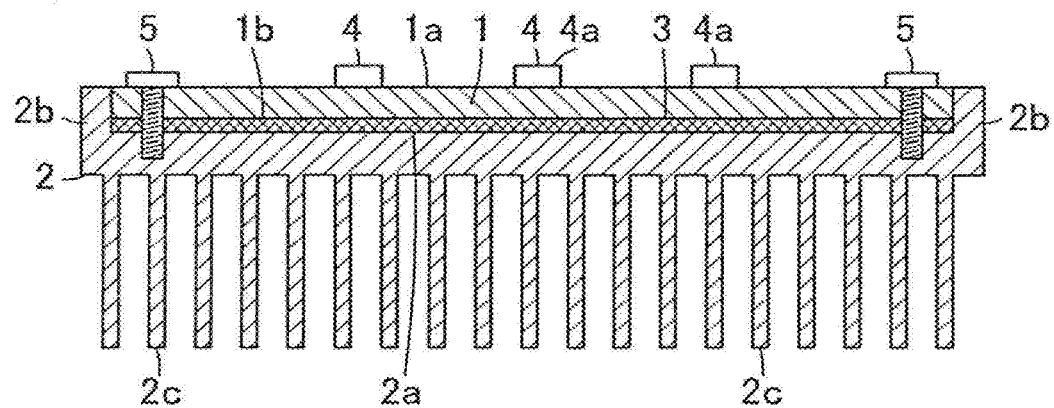
FIG. 1 is a sectional view of an electronic component mounting module according to one embodiment of the present invention.
Figure 2:
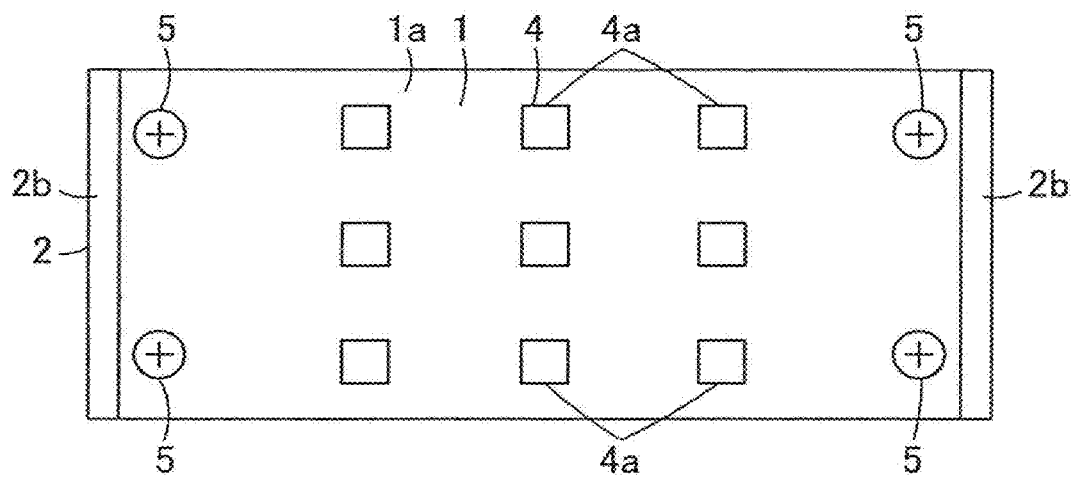
FIG. 2 is a plan view of the electronic component mounting module.

As shown in FIG. 1 and FIG. 2, an electronic component mounting module includes a board 1 having the surface 1a being one side thereof made into a mounting surface and the back surface 1b being the other side of the opposite side disposed on a heat radiating member 2, and a metallic fine particle layer 3 made to intervene between the back surface 1b of the board 1 and the heat radiating member 2.

A plurality of LEDs 4a being semiconductor elements operating as an electronic component 4 are mounted on the surface 1a of the board 1 by a surface mounting system. In the present embodiment, nine LEDs 4a (three in the longitudinal direction and three in the horizontal direction) are mounted in the form of a matrix. The LEDs 4a are an SMD (Surface Mount Device) type package, which is generally provided with an LED chip disposed on a base formed of ceramics, and a translucent molding resin such as an epoxy resin and silicone resin, etc., to seal the LED chip. A blue LED chip that emits blue light is used for the LED chip, and the translucent molding resin contains a fluorescent body that absorbs light from the LED chip and generates yellow-oriented light. Therefore, the light from the LED chip passes through the translucent resin and is emitted outside after being turned into white or a white-oriented luminescent color such as a white bulb color. In addition, the LEDs 4a may be mounted directly on the board 1 by the COB (Chip-On-Board) system. That is, the mounting system is not specially limited.

A ceramics material that is a non-metallic insulative material able to be composed cheaper than metal, has high thermal conductivity and is excellent in durability is used as the board 1, and the board 1 is formed to be an approximately rectangular plate. A wiring pattern is formed by a copper foil on the surface 1a of the board 1, and a resistant layer is appropriately formed thereon. A plurality of LEDs 4a are mounted on the wiring pattern.

Further, the heat radiating member 2 is made of metal having high thermal conductivity such as, for example, aluminum, etc., and is provided with a planar junction surface 2a to which the board 1 is attached and cemented. The junction surface 2a is formed to be approximately rectangular as in the board 1. Further, a locking frame 2b for positioning and locking the board 1 is caused to protrude from and is formed at both ends in the lengthwise direction of the junction surface 2a of the heat radiating member 2. Still further, a number of heat radiating fins 2c, which increase the surface area of heat radiation, are caused to protrude from and are formed at the side opposite to the junction surface 2a of the heat radiating member 2.

When attaching the board 1 to the heat radiating member 2, the board 1 is arranged so that the rear surface 1b of the board 1 is opposed to the junction surface 2a of the heat radiating member 2, and is tightened to the heat radiating member 2 at four points being a plurality of points at both end sides of the board 1 by means of a plurality of screws 5 operating as the fixing means and is fixed thereat.

Also, the heat radiating member 2 includes a so-called heat sink, electrical apparatus main body, case or cover, etc. In summary, the heat radiating member. 2 means a member thermally coupled to the board 1 and having high thermal conductivity. Therefore, for example, in a lighting device operating as the electrical apparatus, where the rear surface 1b of the board 1 is opposed to and attached to the main body of the lighting device, the lighting device main body corresponds to the heat radiating member 2.

Figure 3:
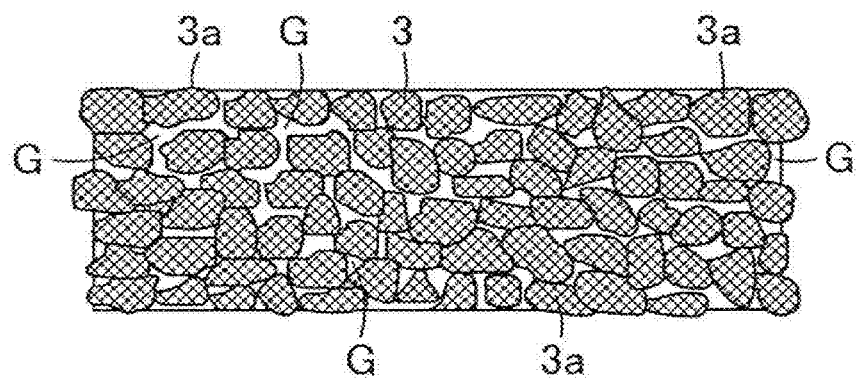
FIG. 3 is a partially sectional view schematically showing a metallic fine particle layer of the electronic component mounting module.

Next, a description is given of the metallic fine particle layer 3 made to intervene between the board 1 and the heat radiating member 2 with reference to FIG. 3.

The metallic fine particle layer 3 is such that metallic fine particles 3a are formed of, for example, silver, copper, aluminum, gold and an alloy thereof, have thermal conductivity of 200 W/mk or more, an average grain size of 3 μm or so, and are of irregular grains. The metallic fine particle layer 3 is formed so that, after the metallic fine particles 3a are dispersed in a solvent to prepare paste, and the paste is coated on the rear surface 1b of the board 1 or the junction surface 2a of the heat radiating member 2 by screen printing, the board 1 or the heat radiating member 2 is placed in a heating furnace and is heated at a temperature of 850° C. for ten minutes, thereby baking the paste and hardening the same. Irregular between-particle gaps G are formed between the metallic fine particles 3a through this baking treatment, wherein the metallic fine particle layer 3 will have a deformable flexibility by virtue of the between-particle gap G. In addition, if the average grain size of the metallic fine particles 3a is smaller than 3 μm, a sufficient layer thickness cannot be obtained for the metallic fine particle layer 3, wherein sufficient flexibility also cannot be obtained.

The layer thickness dimension of the metallic fine particle layer 3 is formed to be 3 μm or more, preferably in the range from 10 μm through 50 μm. If the layer thickness dimension is smaller than 3 μm (preferably 10 μm), no deformable flexibility is obtainable at the metallic fine particle layer 3, and no sufficient effect is obtainable by which the adhesion between the board 1 and the heat radiating member 2 is increased and the thermal conductivity is improved. Also, if the layer thickness dimension is 50 μm or more, it becomes difficult to easily produce the metallic fine particle layer 3 at low cost. Further, where it is not necessary that costs and productivity are taken into consideration, it does not matter that the layer thickness dimension of the metallic fine particle layer 3 may be made 50 μm or more. In this case, it is possible to adjust the layer thickness dimension to a desired layer thickness dimension by repeating the screen printing process a plurality of times.

The metallic fine particle layer 3 thus formed has high conductivity of 200 W/mk or more, and has deformable flexibility based on existence of the between-particle gap G.

Figure 4:
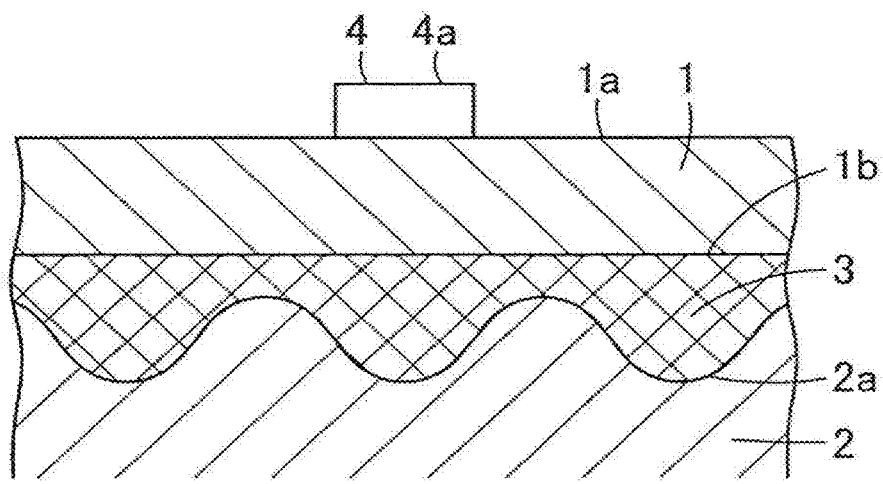
FIG. 4 is a partially sectional view schematically showing the electronic component mounting module and a heat radiating member.

For this reason, as shown in FIG. 1 and FIG. 2, by tightening the board 1 and the heat radiating member 2 by means of screws with the metallic fine particle layer 3 intervening therebetween and fixing the same, minute unevenness on the rear surface 1b of the board 1 and the junction surface 2a of the heat radiating member 2 and unevenness due to foreign substances attached thereto are absorbed by deformation of the metal fine particle layer 3, wherein the metallic fine particle layer 3 is adhered to the rear surface 1b of the board 1 and the junction surface 2a of the heat radiating member 2. For example, FIG. 4 schematically shows an example in which unevenness exists on the junction surface 2a of the heat radiating member 2. In this example, the metallic fine particle layer 3 is formed on the board 1, and the metallic fine particle layer 3 of the board 1 is cemented to the junction surface 2a of the heat radiating member 2, wherein the metallic fine particle layer 3 is deformed along the unevenness of the junction surface 2a of the heat radiating member 2 and is adhered thereto.

In addition, when tightening and fixing the board 1 and the heat radiating member 2 by means of screws 5 with the metallic fine particle layer 3 intervening therebetween, the metallic fine particle member 3 has a cushioning property, wherein thermal adhesion between the board 1 and the heat radiating member 2 is obtained without intensively tightening the screws 5, making it possible to prevent the ceramics board 1 from being broken due to tightening.

In the electronic component mounting module constructed as described above, when power is turned on, a lighting circuit (not illustrated) is driven and power is supplied to the LEDs 4a mounted on the board 1, wherein the LEDs 4a emit light.

Heat generated from the LEDs 4a in line with light emission of the LEDs 4a is thermally transmitted, in sequence, to the board 1, the metallic fine particle layer 3, and the heat radiating member 2, and is radiated from the heat radiating member 2.

At this time, since the metallic fine particle layer 3 is made to intervene between the board 1 and the heat radiating member 2 and the metallic fine particle layer 3 is deformed along the minute unevenness on the rear surface 1b of the board 1 and on the junction surface 2a of the heat radiating member 2 and the unevenness resulting from foreign substances attached thereto, and is adhered thereto, it is possible to greatly secure the mutual contacting area between the rear surface 1b of the board 1, the junction surface 2a of the heat radiating member 2 and the metallic fine particle layer 3. Therefore, thermal adhesion between the board 1 and the heat radiating member 2 is high, wherein the thermal conductivity becomes satisfactory.

Accordingly, the heat generated from the LEDs 4a is efficiently transmitted, in sequence, to the board 1, the metallic fine particle layer 3 and the heat radiating member 2, and can be effectively radiated from the heat radiating member 2.

Next, in order to confirm such a heat radiating effect, with respect to the present embodiment in which the metallic fine particle layer 3 is made to intervene between the board 1 and the heat radiating member 2 and the comparative example in which no metallic fine particle layer 3 is made to intervene, the junction temperature of the LEDs 4a was measured. And, the results shown in FIG. 5 were obtained. In addition, for the measurement conditions, ceramics the thermal conductivity of which is 30 W/mk was used for the board 1, and metal the thermal conductivity of which is 200 W/mk or more was used for the heat radiating member 2. The thermal conductivity of the metal fine particle layer 3 according to the present embodiment is 200 W/mk or more.

As has been found from the results, if it is assumed that the junction temperature of the comparative example is 100%, it could be confirmed in the present embodiment that the junction temperature was lowered to 85%. Therefore, in the present embodiment, it was confirmed that the thermal conduction and heat radiation were effectively carried out, and the LEDs 4a were prevented from rising in temperature.

Next, a description is given of the reason why it is preferable that ceramics is used for the board 1 and the metallic fine particle layer 3 is used as the junction member made to intervene between the board 1 and the heat radiating member 2, with reference to FIG. 4 described above.

For example, glass epoxy resin, etc., is available in addition to ceramics according to the present embodiment as the non-metallic material of the board 1. Further, as the junction member, generally, silicone resin has widely been used in order to improve thermal conductivity by adhering two members together to fill up the gap therebetween. The thermal conductivity of the glass epoxy resin and silicone resin is 1 W/mk or so.

First, a description is given of a case where the board 1 is made of glass epoxy resin. Where silicone resin the thermal conductivity of which is 1 W/mk or so is made to intervene between the board 1 made of glass epoxy resin the thermal conductivity of which is 1 W/mk or so and the metal heat radiating member 2 the thermal conductivity of which is 200 W/mk or more, the contacting area between the board 1 and the silicone resin side, the thermal conductivities of which are the same 1 W/mk or so, and the heat radiating member 2 side the thermal conductivity of which is 200 W/mk or more is increased, and the thermal conductivity is improved. Further, where the metallic fine particle layer 3 the thermal conductivity of which is 200 W/mk or more is made to intervene, the contacting area between the heat radiating member 2 and the metallic fine particle member 3 side the thermal conductivities of which are the same 200 W/mk or more and the board 1 side the thermal conductivity of which is 1 W/mk or so is increased, the thermal conductivity is improved. However, with respect to any case where the board 1 is formed of glass epoxy resin or ceramics, almost the same effect can be brought about in terms of improvement in the thermal conductivity from the board 1 to the heat radiating member 2.

Next, a description is given of a case where the board 1 is formed of ceramics. Where silicone resin the thermal conductivity of which is 1 W/mk or so is made to intervene between the ceramics board 1 the thermal conductivity of which is 30 W/mk and the metallic heat radiating member 2 the thermal conductivity of which is 200 W/mk or more, the effect of improvement in the thermal conductivity from the board 1 to the heat radiating member 2 is low since the silicone resin having a lower thermal conductivity than those of the board 1 and the heat radiating member 2 intervenes therebetween. In addition, where the metallic fine particle layer 3 the thermal conductivity of which is 200 W/mk or more is made to intervene, the contacting area between the heat radiating member 2 and the metallic fine particle layer 3 side the same thermal conductivities of which are 200 W/mk or more and the board 1 side the thermal conductivity of which is 30 W/mk is increased, and the thermal conductivity is improved.

Accordingly, by adopting a combination in which ceramics is used for the board 1 and the metallic fine particle layer 3 is used as a junction material made to intervene between the board 1 and the heat radiating member 2, it is possible to increase the effect of improvement in the thermal conductivity from the board 1 to the heat radiating member 2.

As described above, according to the present embodiment, since the metal fine particle layer 3 is made to intervene between the ceramics board 1 and the heat radiating member 2, the thermal adhesion between the board 1 and the heat radiating member 2 can be increased, and the heat generated from the LEDs 4a can be efficiently transmitted from the board 1 to the heat radiating member 2, wherein the heat can be effectively radiated from the heat radiating member 2.

Also, since the metallic fine particle layer 3 is coated on the board 1 or the heat radiating member 2 by screen printing and is formed so as to intervene between the board 1 and the heat radiating member 2, no intervening substance is required to be provided as a special component, wherein a desired object can be achieved with a simplified composition.

Next, a description is given of an electrical apparatus using an electronic component mounting module. Although illustration of the electrical apparatus is omitted, the electrical apparatus may be a lighting device or a display, etc. Either one may use the electronic component mounting module. Also, in this case, the main body of the electrical apparatus may be used as the heat radiating member 2, and a heat radiating member 2 may be separately provided. According to such an electrical apparatus, it is possible to provide an electrical apparatus that can bring about an effect of the electronic component mounting module described above.

Furthermore, the present invention is not limited to the configuration according to the embodiment described above. The invention may be subjected to various modifications within the scope not departing from the spirit of the invention. For example, although ceramics is preferably used as the material of the board, glass epoxy resin, other non-metallic metals may be adopted. Also, although it is preferable that the metallic fine particle layer is formed on the board, the metallic fine particle layer may be formed at the heat radiating member side, or may be formed at both sides thereof. Further, although coating by screen printing is preferable to form the metallic fine particle layer, the method is not limited thereto, wherein the metallic fine particle layer may be coated by another method.

What is claimed is:

1. An electronic component mounting module including:
   a ceramic board comprising a first surface and a second surface;
   an LED, which generates heat when operating, mounted on the first surface of the ceramic board;
   a heat radiating member comprising a surface, wherein the second surface of the ceramic board is disposed on the surface of the heat radiating member; and
   a metallic fine particle layer comprising a plurality of metallic fine particles having gaps therebetween, having a layer thickness in a range from 3 μm through 50 μm, formed so as to be made to intervene between the second surface of the ceramic board and the surface of the heat radiating member, and deformed along an unevenness of the surface of the heat radiating member.

2. The electronic component mounting module according to claim 1, wherein the metallic fine particle layer is formed on the ceramic board.

* * * * *